United States Patent
Kim et al.

(10) Patent No.: US 7,335,449 B2
(45) Date of Patent: Feb. 26, 2008

(54) MASKS EACH HAVING A CENTRAL MAIN PATTERN REGION AND A PERIPHERAL PHANTOM PATTERN REGION WITH LIGHT-TRANSMITTING FEATURES IN BOTH PATTERN REGIONS HAVING THE SHAME SHAPE AND PITCH AND METHODS OF MANUFACTURING THE SAME

(75) Inventors: Sung-Hyuck Kim, Suwon-si (KR);
In-Kyun Shin, Yongin-si (KR);
Dong-Hoon Chung, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 600 days.

(21) Appl. No.: 10/870,442

(22) Filed: Jun. 18, 2004

(65) Prior Publication Data
US 2005/0064300 A1   Mar. 24, 2005

(30) Foreign Application Priority Data
Jun. 20, 2003   (KR) .................... 10-2003-0040280

(51) Int. Cl.
*G03F 1/00*   (2006.01)
*G03F 1/08*   (2006.01)
(52) U.S. Cl. ........................................ 430/5
(58) Field of Classification Search .............. 430/5
See application file for complete search history.

(56) References Cited

U.S. PATENT DOCUMENTS

| | | | |
|---|---|---|---|
| 6,537,837 B2* | 3/2003 | Lee ............................. | 430/5 |
| 2002/0052122 A1* | 5/2002 | Tanaka et al. ................ | 430/5 |
| 2002/0081502 A1* | 6/2002 | Hayano et al. ............... | 430/5 |
| 2002/0177048 A1* | 11/2002 | Saitoh et al. ................ | 430/5 |
| 2003/0198872 A1* | 10/2003 | Yamazoe et al. .............. | 430/5 |
| 2003/0203285 A1* | 10/2003 | Chung et al. ................ | 430/5 |

FOREIGN PATENT DOCUMENTS

| | | |
|---|---|---|
| JP | 5-241319 | 9/1993 |
| KR | 10/0190116 | 1/1999 |
| KR | 2003-001985 | 1/2003 |

* cited by examiner

*Primary Examiner*—Mark F. Huff
*Assistant Examiner*—John Ruggles
(74) *Attorney, Agent, or Firm*—Volentine & Whitt, PLLC (57) ABSTRACT

A mask and a method of forming the mask obviate optical proximity effects. The mask includes a light-shielding layer on a transparent substrate. The light-shielding layer is patterned to form a main pattern and a phantom pattern. The main and phantom patterns each have a light shielding portion and a light-transmitting portion. The pitch of the features constituting the phantom pattern is identical to the pitch of the features constituting the main pattern. The shape of the light-transmitting features of the phantom pattern region is identical to the shape of the light-transmitting features of the main pattern region.

12 Claims, 10 Drawing Sheets

Fig. 1

(PRIOR ART)

Fig. 2

(PRIOR ART)

Fig. 3

(PRIOR ART)

Fig. 4

(PRIOR ART)

Fig. 6

(PRIOR ART)

| Focus(μm) | Intensity |
|---|---|
| -0.5 | 0.25 |
| -0.4 | 0.27 |
| -0.3 | 0.28 |
| -0.2 | 0.29 |
| -0.1 | 0.31 |
| 0.0 | 0.32 |
| 0.1 | 0.32 |
| 0.2 | 0.31 |
| 0.3 | 0.31 |
| 0.4 | 0.30 |
| 0.5 | 0.28 |

(I)

| Focus(μm) | Intensity |
|---|---|
| -0.5 | 0.23 |
| -0.4 | 0.26 |
| -0.3 | 0.28 |
| -0.2 | 0.30 |
| -0.1 | 0.32 |
| 0.0 | 0.32 |
| 0.1 | 0.33 |
| 0.2 | 0.32 |
| 0.3 | 0.31 |
| 0.4 | 0.30 |
| 0.5 | 0.28 |

| Focus(μm) | Intensity |
|---|---|
| -0.5 | 0.24 |
| -0.4 | 0.26 |
| -0.3 | 0.28 |
| -0.2 | 0.29 |
| -0.1 | 0.30 |
| 0.0 | 0.30 |
| 0.1 | 0.30 |
| 0.2 | 0.31 |
| 0.3 | 0.29 |
| 0.4 | 0.28 |
| 0.5 | 0.27 |

(I)

| Focus(μm) | Intensity |
|---|---|
| -0.5 | 0.20 |
| -0.4 | 0.22 |
| -0.3 | 0.24 |
| -0.2 | 0.25 |
| -0.1 | 0.26 |
| 0.0 | 0.26 |
| 0.1 | 0.26 |
| 0.2 | 0.25 |
| 0.3 | 0.24 |
| 0.4 | 0.22 |
| 0.5 | 0.21 |

MASKS EACH HAVING A CENTRAL MAIN PATTERN REGION AND A PERIPHERAL PHANTOM PATTERN REGION WITH LIGHT-TRANSMITTING FEATURES IN BOTH PATTERN REGIONS HAVING THE SHAME SHAPE AND PITCH AND METHODS OF MANUFACTURING THE SAME

BACKGROUND OF THE INVENTION

1. Field of the Invention

The present invention relates to the process of photolithography used in fabricating semiconductor devices and the like. More specifically, the present invention relates to a mask used to carry out a photolithographic process and to a method for forming the same.

2. Description of the Related Art

Photolithography is a known process essential to the fabricating of memory devices such as DRAMs, SRAMs and flash memory devices. Photolithography comprises pattern transcription from mask to resist. More specifically, the pattern transcription is carried out by arranging a mask over a resist layer on a wafer, and exposing the resist to light of a specific wavelength through the mask. As a result, the pattern of the mask is transferred to the resist. Ideally, the pattern of the mask is transcribed accurately onto the resist.

However, photolithography is prone to pattern transference problems referred to as "optical proximity effects." Optical proximity effects occur when forming the very fine patterns necessary to produce a highly integrated circuit. The light waves passing through the closely spaced pattern features of the mask produce interference, thereby distorting the final transferred pattern. These distortions manifest themselves as variations in the dimensions of the patterned resist or as a rounding of ends of the patterns. The optical proximity effects become more pronounced the finer the pattern features are and the thicker the resist is.

Figure 1:
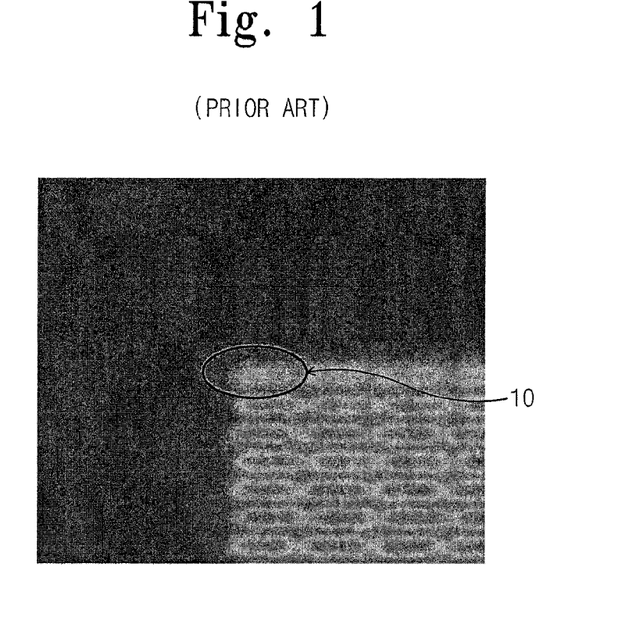
FIG. 1 is a photograph of a wafer patterned using a conventional mask.
Figure 2:
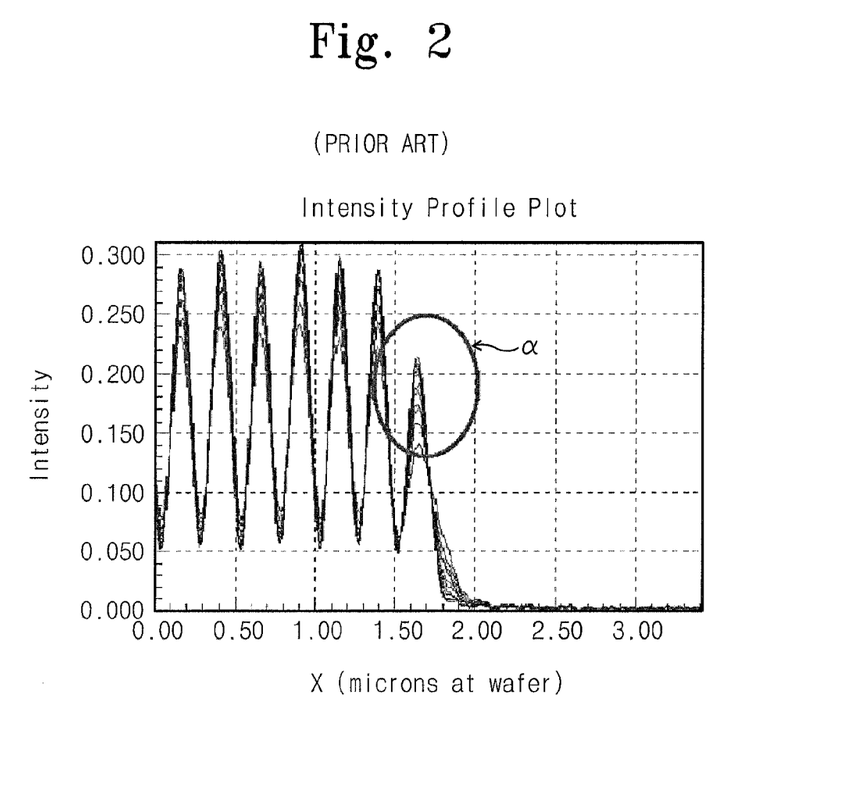
FIG. 2 is a graph of the profile of light intensity when carrying out an exposure process using the conventional mask.

When optical proximity effects occur, the dimensions of dense and fine patterns transferred to the wafer are different from each other even though the dimensions of the corresponding features of the mask pattern are the same. In some instances, pattern features are not transferred at all from the mask to the wafer. For example, as shown in FIG. 1, feature 10 at the edge of the pattern is smaller than the same features of the main part of the pattern. As illustrated in FIG. 2, the intensity of the exposure light at the edge α of the pattern is lower than that of the light used to expose the main part of the pattern adjacent the edge α.

A number of techniques have been studied in an attempt to overcome the significant problems of optical proximity effects.

Figure 3:
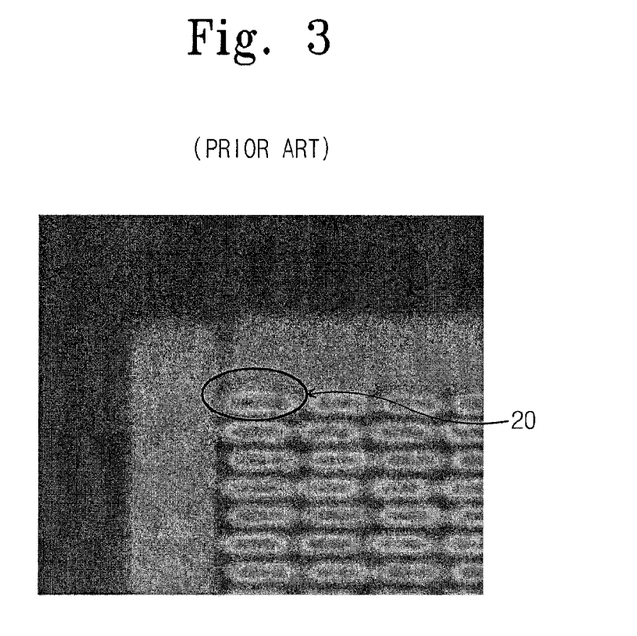
FIG. 3 is a photograph of a wafer patterned using another conventional type of mask.

One approach, as is illustrated in FIG. 3, is to design the mask so that the feature 20 at the edge of the pattern is enlarged by an amount considered beforehand, whereby the features of the resultant pattern all have approximately the same dimensions. However, this approach can still be subject to problems resulting from interference such that incomplete patterns are formed.

Figure 4:
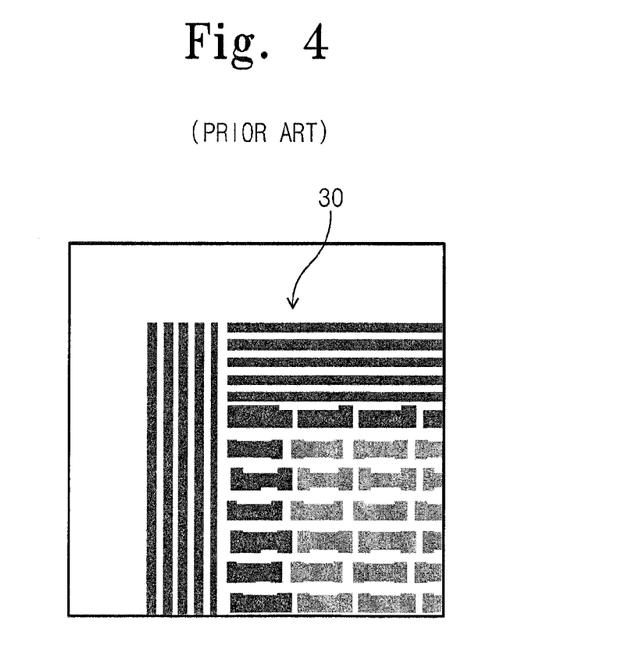
FIG. 4 is a top view of the conventional mask used in the process of patterning the wafer shown in FIG. 3.
Figure 5:
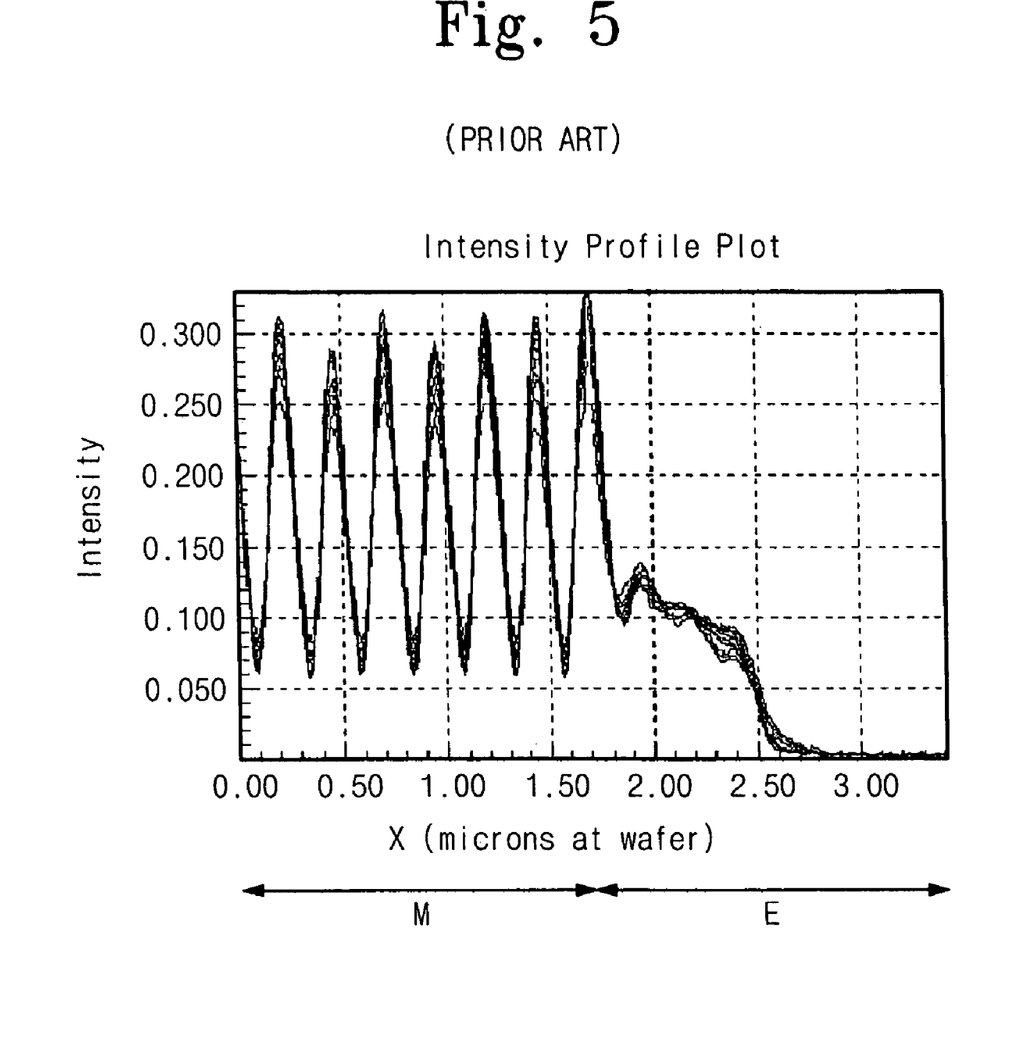
FIG. 5 is a graph of a profile of light intensity when carrying out an exposure process using the conventional mask shown in FIG. 4.

Another approach, shown in FIG. 4, is to form a line and space type of auxiliary pattern 30 around a main pattern (desired pattern) on the mask. As is illustrated in FIG. 5, the intensity of light transmitted through the region E of the mask containing the auxiliary pattern region is lower than that of light transmitted through the region M containing the main pattern. Specifically, the intensity of the light transmittable through the auxiliary pattern region E is less than the critical intensity (0.20 in this example) required for the patterning of the resist, i.e., required for facilitating the photochemical reaction in the resist.

Figure 6:
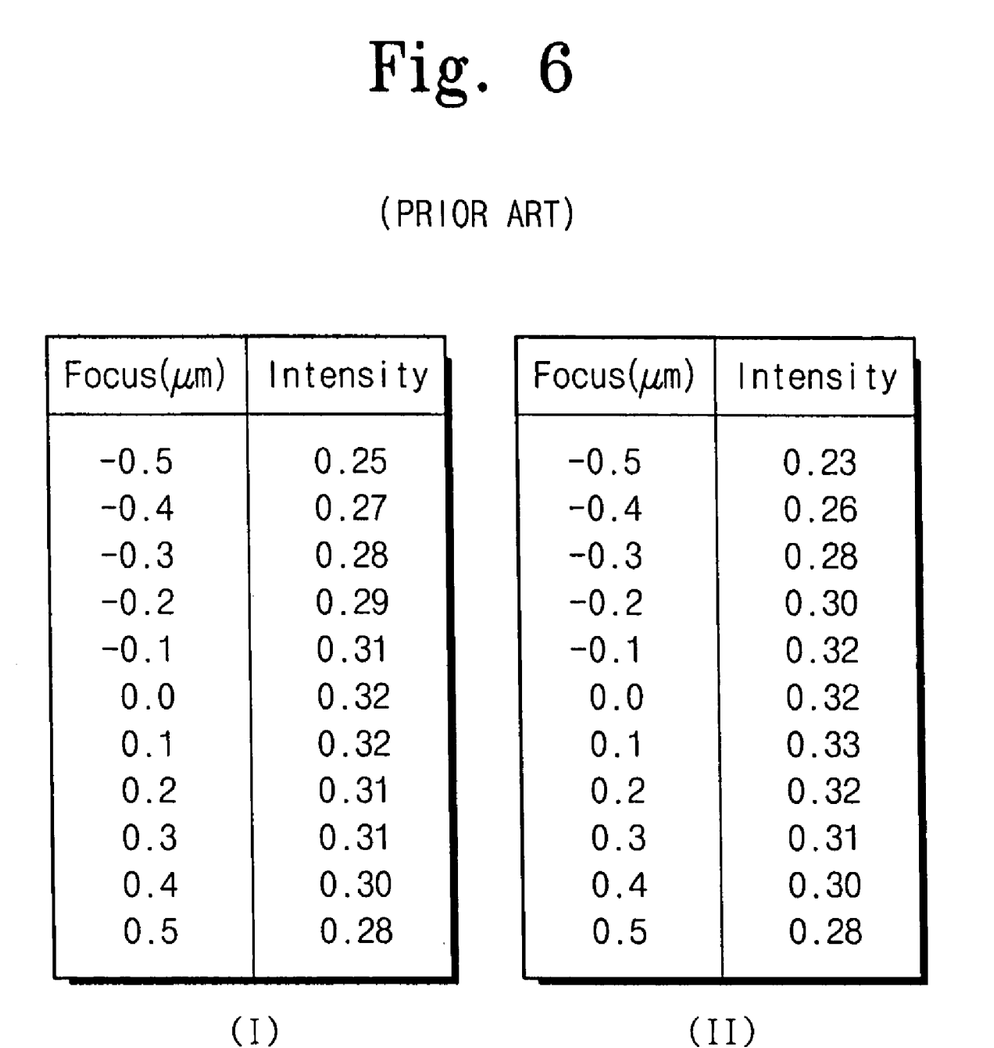
FIG. 6 shows a correlation between light intensity and focus at the main and edge parts of the pattern formed using the conventional mask shown in FIG. 4.

However, referring to FIG. 6, the change in light intensity at the edge II of the pattern is larger than change in light intensity at the main part I of the pattern. This means that the focus margin at the edge part II is lower than the focus margin at the main part I.

Figure 7:
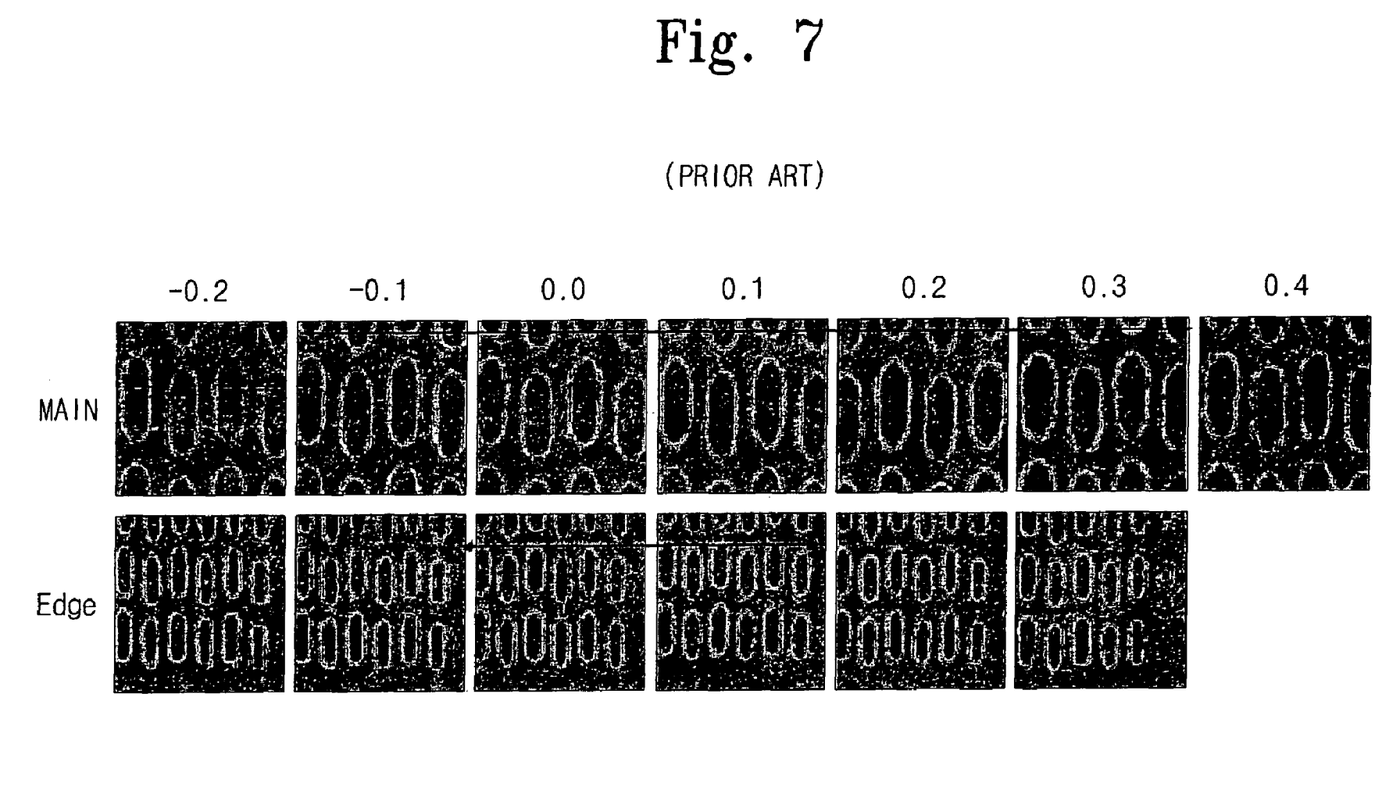
FIG. 7 shows main and edge parts of a pattern formed using the conventional mask shown in FIG. 4.

Referring to FIG. 7, complete patterning is obtained in the main part of the pattern within a range of focus of −0.1 to +0.3 μm, and analogous patterning is obtained outside this range of focus. However, complete patterning is obtained in the edge part of the pattern only within a range of focus of from 0.0 to +0.1 μm, and incomplete patterning occurs outside this range of focus of 0.0 to +0.1 μm. Thus, securing a range of focus acceptable for all of the photolithographic processes necessary to fabricate a semiconductor device requires revising a mask having a line and space pattern. That is, a number of such masks are required, which incurs increased manufacturing costs.

SUMMARY OF THE INVENTION

An object of the present invention is to overcome the above-mentioned problems of the prior art.

In particular, one object of the present invention to provide a mask and a method of forming the same that effectively eliminate optical proximity effects.

According to one aspect of the present invention, the mask comprises a main pattern corresponding to the desired pattern for transcription, and a phantom pattern provided alongside the main pattern at a peripheral region of the mask to minimize the intensity of light at the edge of the transcribed pattern. The shape and pitch of respective features of the phantom pattern are identical to those of the main pattern, respectively. However, the light-transmitting features of the phantom pattern are under-sized (narrower) compared to those of the main pattern and/or the light-transmitting features of the phantom pattern scatter incident light to such an extent that the light transmitted by the portion of the mask containing the phantom pattern will not expose the resist, i.e., will not facilitate the patterning of the wafer.

According to another aspect of the present invention, a method of forming the mask comprises steps of: providing a transparent substrate, forming a light-shielding layer on the transparent substrate, and patterning the light-shielding layer to form the main pattern and phantom pattern.

The main pattern and the phantom pattern each comprise portions of the light-shielding layer that absorb the exposure light and thereby shield the substrate, and exposed portions of the transparent substrate that transmit the exposure light. The patterning is carried out so that the pitch of the light-shielding and exposed portions constituting the phantom pattern are identical to the pitch of the light-shielding and exposed portions constituting the main pattern, and so that the shape of the exposed portions of the substrate constituting the phantom pattern are identical to the shape of the exposed portions of the substrate constituting the main pattern.

The exposed portions of the substrate constituting the phantom pattern may be the same size as the exposed portions of the substrate constituting the main pattern. In this case, part of the transparent substrate is removed, i.e., etched way, at each of the exposed portions of the substrate constituting the phantom pattern so that light is scattered by the sidewalls of the substrate defining the resulting trenches.

Alternatively, the exposed portions of the substrate constituting the phantom pattern may be narrower than the exposed portions of the substrate constituting the main pattern. In this case as well, each of the exposed portions of the substrate can be etched to form trenches in the substrate.

BRIEF DESCRIPTION OF THE DRAWINGS

These and other objects, features and advantages of the present invention will become better understood from the following detailed description of the preferred embodiments made with reference to the accompanying drawings, of which.

DETAILED DESCRIPTION OF THE PREFERRED EMBODIMENTS

The First Embodiment

Figure 8:
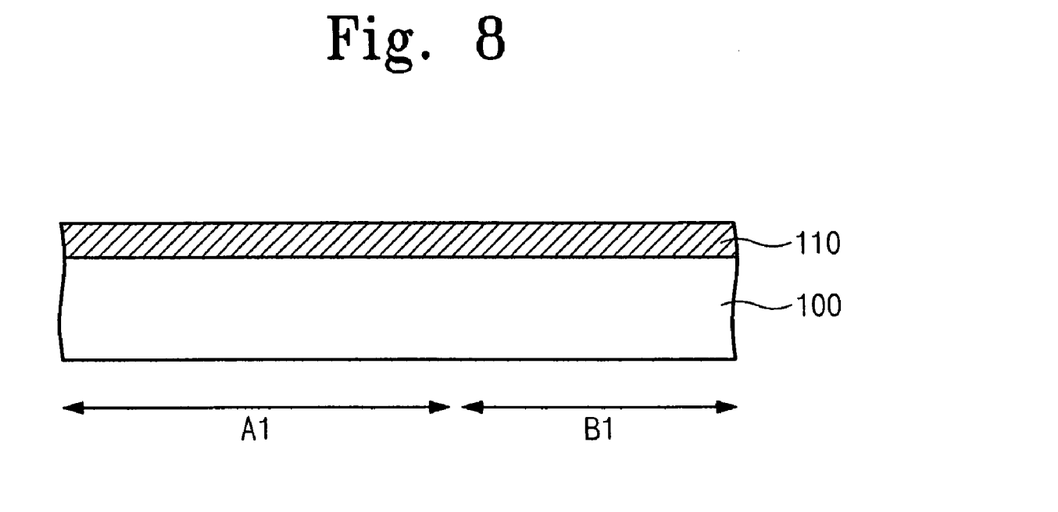
FIGS. 8 and 9 are sectional views of a substrate illustrating a first embodiment of a method of forming a mask according to the present invention.
Figure 9:
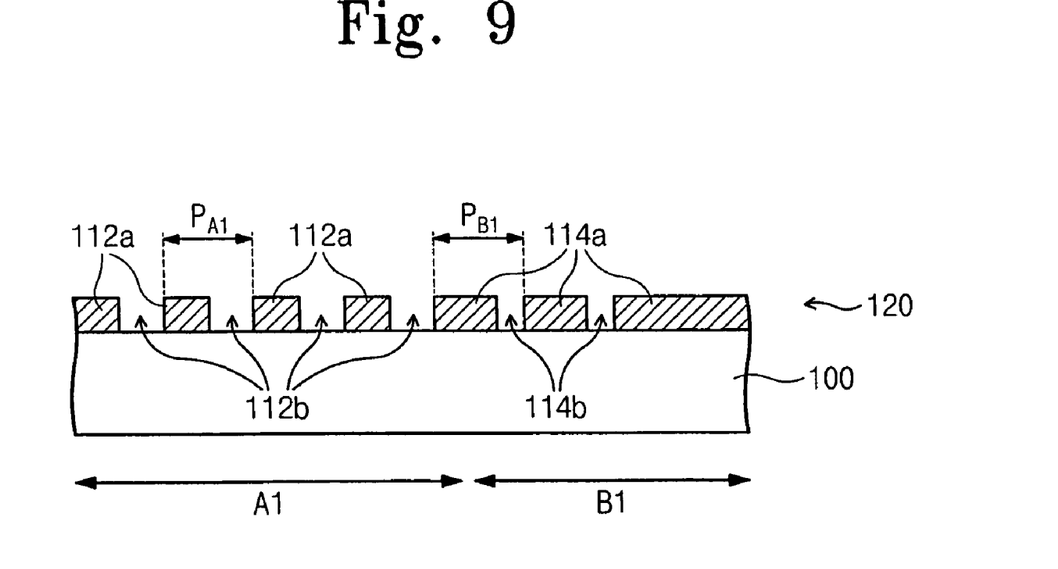

Referring to FIGS. 8 and 9, the mask 120 comprises a transparent substrate 100, such as a quartz substrate. The mask is divided into a main pattern region $A_1$ and a phantom pattern region $B_1$. A light shielding layer 110 is formed on the transparent substrate 100. The light shielding layer 110 comprises a material selected from the group consisting of Cr and Mo. Furthermore, the light shielding layer 110 is also formed of a low reflective material, e.g., a polymer.

Referring to FIG. 9, the light shielding layer 110 is patterned to form a main pattern consisting of a main light-shielding portion 112a and a main light-transmitting portion 112b in the main pattern region $A_1$. The main pattern refers to the pattern that is desired to be transferred to the wafer. The shape of the features of and pitch $P_{A1}$ of the main pattern depend on the pattern desired to be transferred to the wafer.

Simultaneously, a phantom pattern comprising a phantom light-shielding portion 114a and a phantom light-transmitting portion 114b is formed in phantom pattern region $B_1$ at the periphery of the main pattern region $A_1$. The phantom pattern refers to a pattern that should not be transferred to the wafer. However, the shape of the features of and pitch $P_{B1}$ of the phantom pattern are identical to those of the main pattern, respectively. On the other hand, the line widths of the main and phantom light-transmitting portions 112b and 114b depend on the design of the pattern, etc.

The phantom light-transmitting portion 114b is undersized as compared to the main light-transmitting portion 112b. The phantom light-transmitting portion 114b is so narrow that intensity of light which can be transmitted through the phantom light-transmitting portion 114b is less than the critical intensity. In other words, the intensity of light that is transmittable through the main light-transmitting portion 112b is great enough to facilitate the patterning of a resist exposed to such light, but the intensity of light that is transmittable through the phantom light-transmitting portion 114b can not facilitate the patterning of the same resist.

Figure 10:
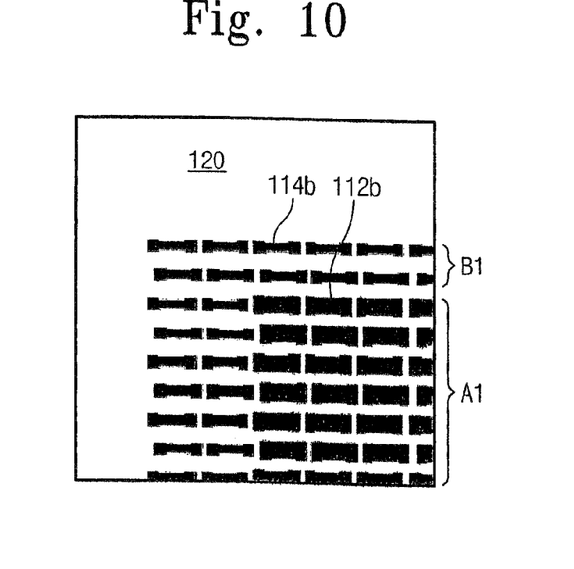
FIG. 10 is a top view of the mask.

Referring to FIG. 10, the phantom light-transmitting portion 114b in the phantom pattern region $B_1$ comprises features that are narrower than the features making up the main light-transmitting portion 112b in the main pattern region $A_1$. However, the shape and pitch of the light-transmitting features in the phantom pattern region $B_1$ are identical to those of the light-transmitting features in the main pattern region $A_1$, respectively.

Figure 11:
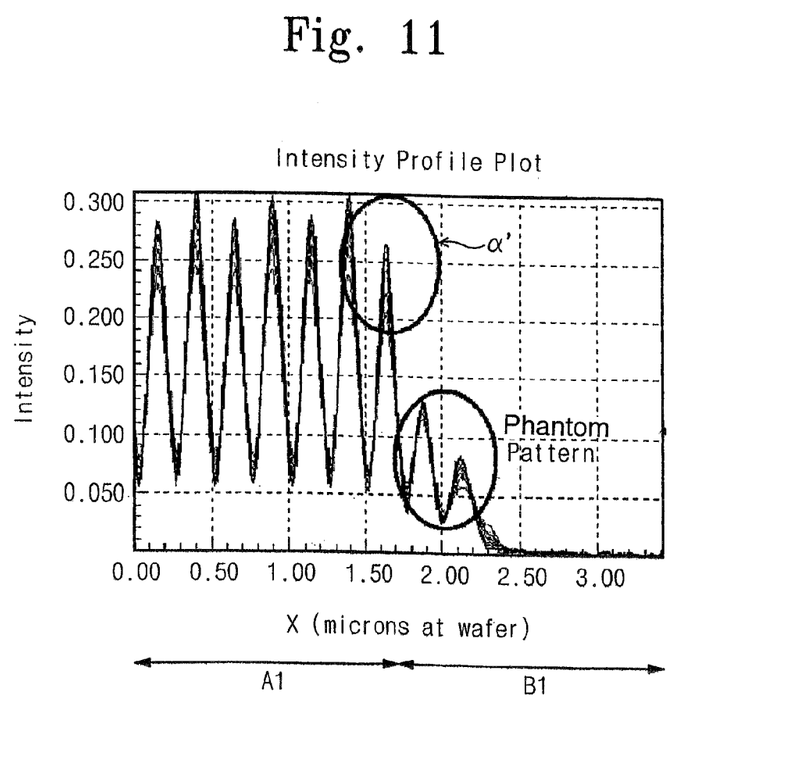
FIG. 11 is a graph of a profile of light intensity when carrying out an exposure process using the mask according to the present invention.

FIG. 11 shows the results of an exposure process using the mask 120 having the main pattern region $A_1$ and the phantom pattern region $B_1$. In this case, the critical intensity of the light for patterning the resist was 0.2. As can be seen from the figure, the intensities of the wavefronts of the light transmitted through the main pattern region $A_1$ are all over the critical intensity, and the intensities of the wavefronts of the light transmitted through phantom pattern region $B_1$ are all under the critical intensity. Therefore, a complete patterning is carried out by light transmitted through the main pattern region $A_1$ but no patterning occurs in that portion of the photoresist exposed to the light transmitted through the phantom pattern region $B_1$.

Also, referring back to FIG. 2, the intensity of light transmitted from the conventional mask at the periphery of the mask pattern is so close to the critical intensity that a complete patterning does not occur, i.e., the intensity of the light at the edge α of the exposure region of the resist is not great enough to produce a coherent feature. On the other hand, the intensity of light transmitted from the mask 120 of the present invention, at the edge of the main pattern region $A_1$, is sufficiently high compared to critical intensity, as to form a complete and coherent feature at the corresponding peripheral part α' of the exposed field of the resist. This is because optical proximity effects at the edge part α' are suppressed. Accordingly, light transmitted through the main pattern region $A_1$ facilitates a complete patterning.

Figure 12:
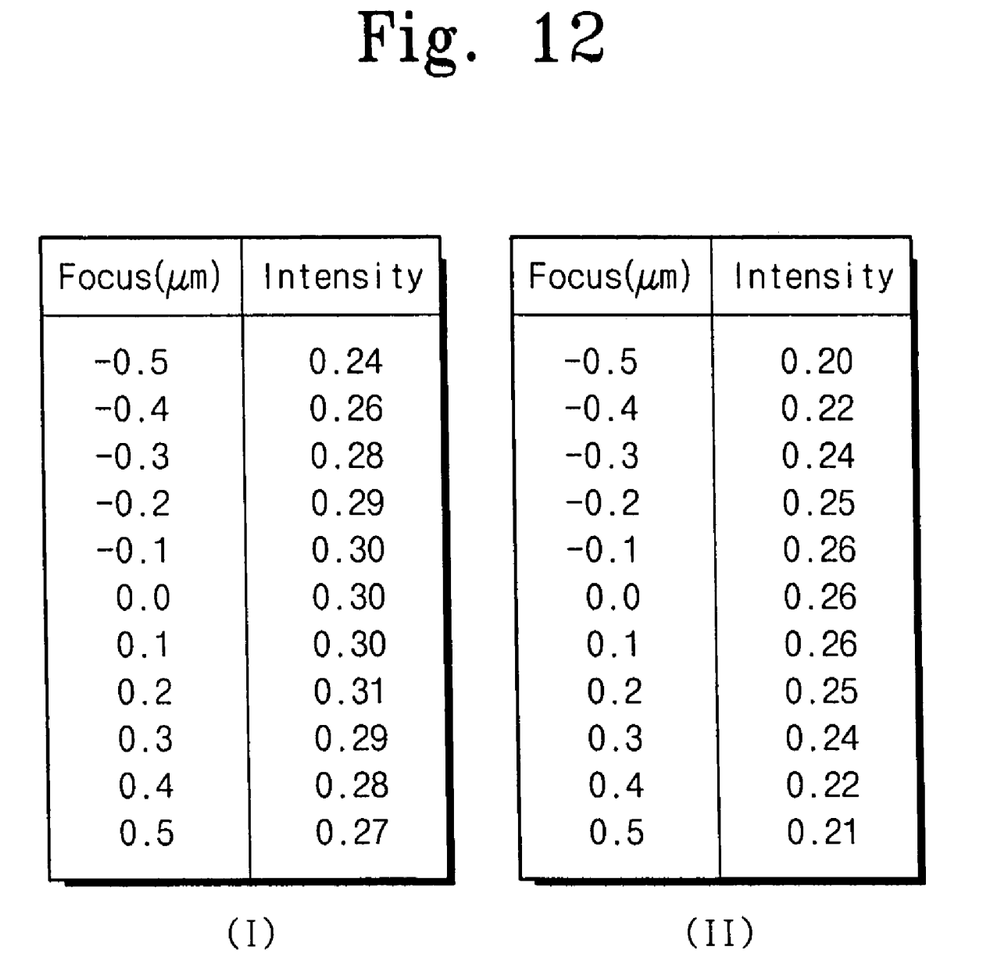
FIG. 12 shows a correlation between light intensity and focus at the main and edge parts of the pattern formed using the first embodiment of the mask according to the present invention.

Referring to FIG. 12, with respect to the main pattern region $A_1$, there is not much of a difference between the variation in intensity in the edge part (II) of the main pattern and the variation in intensity in the main part (I) of the main pattern surrounded by the edge part (II), over a range (−0.5 to +0.5) of focuses. Accordingly, a relatively wide focus margin is secured for the edge part (II) of the main pattern.

The Second Embodiment

Figure 13:
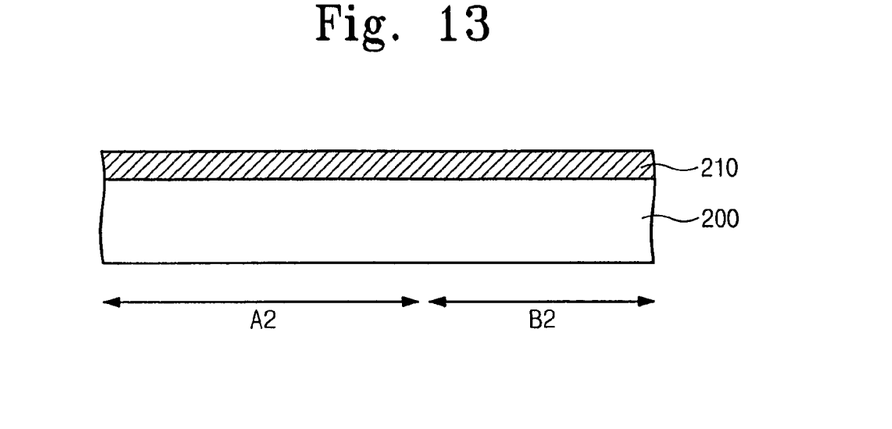
FIGS. 13 through 15 are sectional views of a substrate illustrating a method of forming a second embodiment of a mask according to the present invention.
Figure 14:
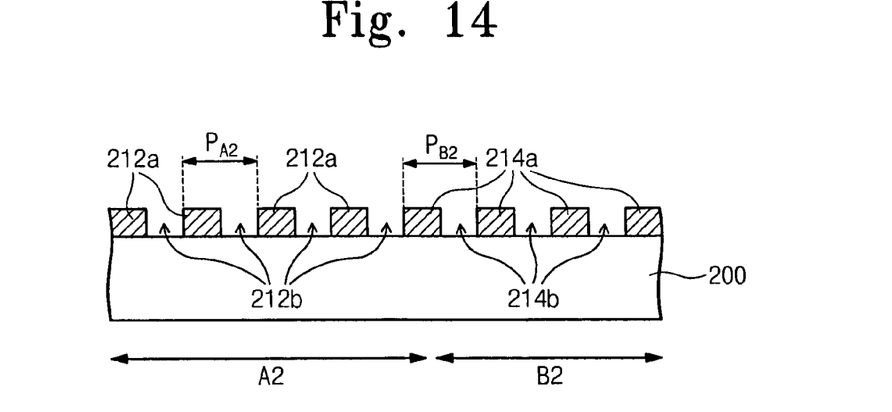
Figure 15:
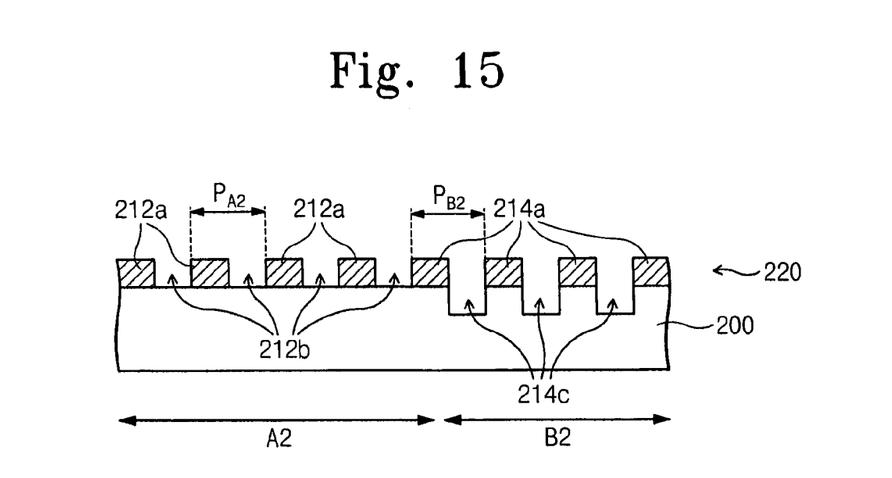

Referring to FIGS. 13-15, the mask 220 comprises a transparent substrate 200 and a light shielding layer 210 formed on the transparent substrate 200. The mask 220 is divided into a main pattern region $A_2$ and a phantom pattern region $B_2$.

Referring to FIG. 14, the light shielding layer 210 is patterned to form a main pattern comprising a main light-shielding portion 212a and a main light-transmitting portion 212b in main pattern region $A_2$, and a phantom pattern comprising a phantom light-shielding portion 214a and a phantom light-transmitting portion 214b in phantom pattern region $B_2$. The shape and pitch of the features of the phantom pattern in phantom pattern region $B_2$ are identical to those of the main pattern in main pattern region $A_2$, respectively. However, the pitch $P_{A1}$ of the features of the main pattern in main pattern region $A_2$ and the pitch $P_{B1}$ of the features of the phantom pattern in the phantom pattern region $B_2$ depend on the design of the pattern to be transcribed onto the wafer.

Referring to FIG. 15, a part of the transparent substrate 200 corresponding to the phantom light-transmitting portion 214b is removed by an etching process. This etching process forms a trench-type of phantom light-transmitting portion 214c in the transparent substrate 200. Light scattering occurs at sidewalls of the substrate 200, defining the sides of the trench-type of phantom light-transmitting portion 214c. The intensity of the light transmitted through the phantom light-transmitting portion 214c becomes less than the intensity of light that is transmittable through the main light-transmitting portion 212b. In this respect, the intensity of light that can be transmitted through the phantom light-transmitting portion 214c should be less than the critical intensity. To this end, the etching process is performed until the trenches in the substrate 200 are so deep that the light which will be transmitted through the phantom light-transmitting portion 214c will not to facilitate the patterning of the resist exposed to such light. This may be accomplished by satisfying the following equation:

$$d=\lambda/2(n-1)$$

(wherein d is the depth of the trench in the substrate, $\lambda$ is the wavelength of the transmitted light, n is the refractive index of the mask substrate).

The light scattering phantom light-transmitting portion 214b acts like the under-sized of phantom light-transmitting portion 212b of the first embodiment. Therefore, the same results occur when using the first and second embodiments of the mask to pattern a wafer.

The Third Embodiment

Figure 16:
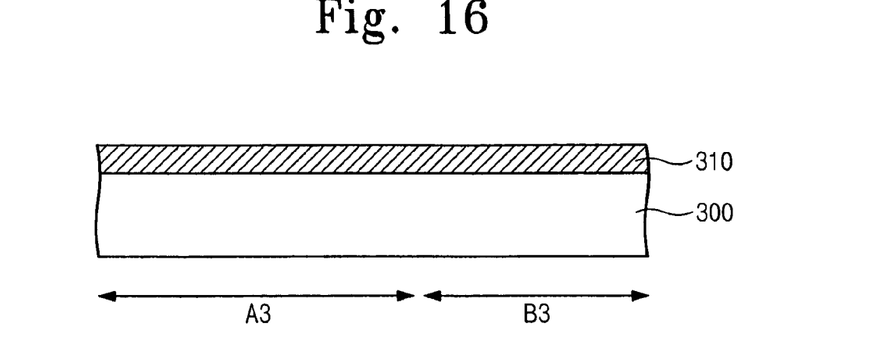
FIGS. 16 through 18 are sectional views of a substrate illustrating a third embodiment of a method of forming a mask according to the present invention.
Figure 17:
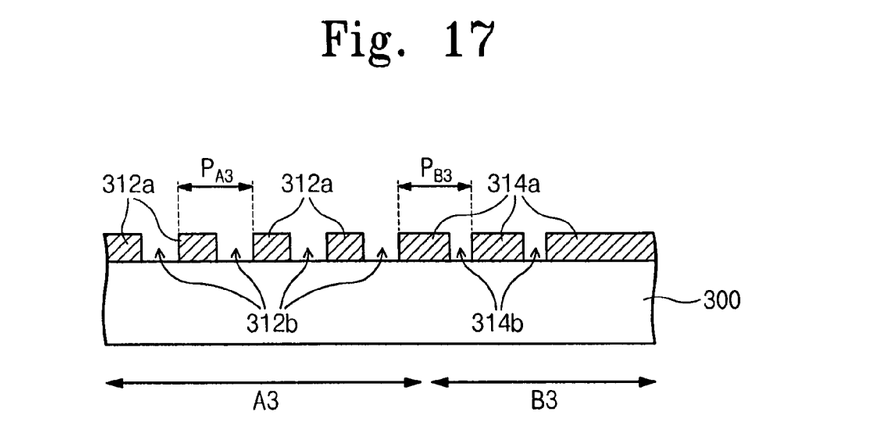
Figure 18:
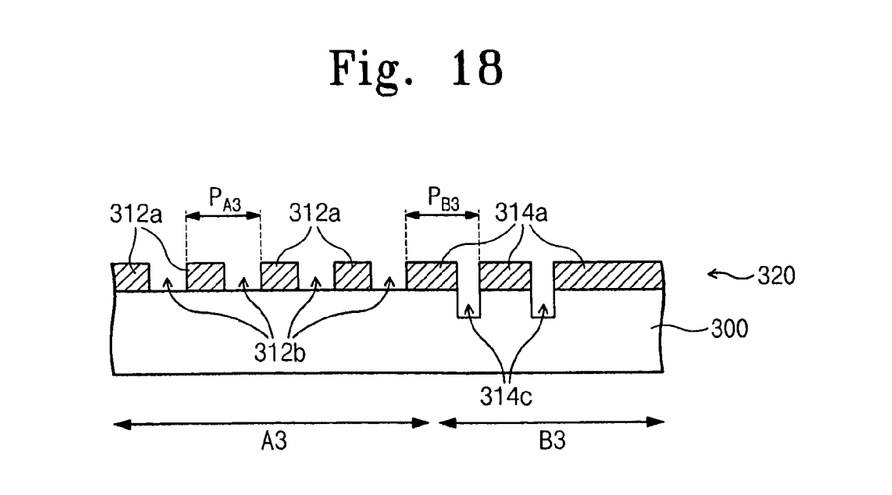

Referring to FIGS. 16-18, a light shielding layer 310 is formed on a transparent substrate 300. The mask 320 is divided into a main pattern region $A_3$ and a phantom pattern region $B_3$.

Referring to FIG. 17, the light shielding layer 310 is patterned to form a main pattern comprising a main light-shielding portion 312a and a main light-transmitting portion 312b in main pattern region $A_3$. The exact shape and pitch $P_{A3}$ of the features constituting the main pattern depend on the design of the pattern to be transcribed onto the wafer.

Simultaneously, a phantom pattern comprising a phantom light-shielding portion 314a and a phantom light-transmitting portion 314b is formed in the phantom pattern region $B_3$ at the periphery of the main pattern region $A_3$. The pitch $P_{B3}$ of the features of the phantom pattern is identical to that of the features of the main pattern. However, the features constituting the phantom light-transmitting portion 314b are smaller (narrower) than those constituting the main light-transmitting portion 312b. The features of the phantom light-transmitting portion 314b are so narrow that the intensity of light transmitted through the phantom light-transmitting portion 314b is less than the critical intensity of the resist. In other words, the intensity of the light transmitted through the main light-transmitting portion 312b is great enough to facilitate the patterning of the resist, but the intensity of the light transmitted through the phantom light-transmitting portion 314b is not great enough to do so. The widths of the features constituting the main and phantom light-transmitting portions 312b and 314b are set based on the design of the pattern to be transcribed onto the wafer.

Referring to FIG. 18, a part of the transparent substrate 300 corresponding to the phantom light-transmitting portion 314b is removed by an etching process. This etching process forms trenches in the transparent substrate 300. Light scattering occurs at sidewalls of the trenches that define the features of the phantom light-transmitting portion 314c.

The intensity of light transmitted through the phantom light-transmitting portion 314c is less than that of the intensity of light transmitted through the main light-transmitting portion 312b due to the scattering of the light at the sidewalls of the substrate 300. In addition, the features constituting the phantom light-transmitting portion 314b are narrower than those constituting the main light-transmitting portion 312b. Therefore, the entirety of the main pattern can be transcribed onto a wafer using the mask 320.

The phantom pattern according to the present invention is applicable to all masks used in photolithography, such as binary masks, halftone attenuated phase shift masks and chrome-less masks. Furthermore, the present invention is applicable to not only positive type photolithographic processes but also to negative type photolithographic processes.

As described above, the present invention provides a mask in which the variations in intensity and focus margin at the edge of the transcribed pattern are improved. Also, the present invention makes it easy to predict the outcome of simulations of the photolithographic process, especially at the edge of the transcribed pattern. Thus, the number of revisions of the mask are few throughout the course of the photolithographic process—from design to completion.

Finally, the present invention was described above in connection with the preferred embodiments thereof. However, those of ordinary skill in the art will recognize that many modifications and variations are possible in light of the above teachings. Therefore, the present invention is not limited to the preferred embodiments. Rather, the true spirit and scope of the invention is defined by the appended claims.

What is claimed is:

1. A mask comprising:
   a transparent substrate having trenches therein;
   a main pattern at a central region of the transparent substrate, said main pattern comprising a main light-shielding portion that absorbs exposure light of a given wavelength and thereby shields the substrate, and a main light-transmitting portion consisting of spaced apart light-transmitting features that transmit the exposure light; and
   a phantom pattern at a peripheral region of the transparent substrate extending along the periphery of the main pattern, said phantom pattern comprising a phantom light-shielding portion that absorbs the exposure light and thereby shields the substrate, and a phantom light-transmitting portion consisting of spaced apart light-transmitting features that transmit the exposure light, the pitch of said features of the light-transmitting portion of said phantom pattern being identical to the pitch of said features of the light-transmitting portion of the main pattern and the shape of the light-transmitting features of said phantom pattern being identical to the shape of the light-transmitting features of said main pattern, and wherein all of the light-transmitting features of the mask that are disposed along the periphery of the main pattern are features formed by substrate whereby the light-transmitting features of said phantom pattern, are formed by the trenches and scatter incident light of said given wavelength at the periphery of the main pattern.

2. The mask of claim 1, wherein at least one of the main light-shielding portion and the phantom light-shielding portion comprises a material selected from the group consisting of Cr and Mo, and a polymer.

3. The mask of claim 1, wherein the transparent substrate comprises quartz.

4. The mask of claim 1, wherein the light-transmitting features of said phantom pattern are identical in size to the light-transmitting features of said main pattern.

5. The mask of claim 4, wherein at least one of the main light-shielding portion and the phantom light-shielding portion comprises a material selected from the group consisting of Cr and Mo, and a polymer.

6. The mask of claim 4, wherein the transparent substrate comprises quartz.

7. The mask of claim 1, wherein the light-transmitting features of said phantom pattern are narrower than the light-transmitting features of said main pattern.

8. The mask of claim 7, wherein at least one of the main light-shielding portion and the phantom light-shielding portion comprises a material selected from the group consisting of Cr and Mo, and a polymer.

9. The mask of claim 7, wherein the transparent substrate comprises quartz.

10. A method for forming a mask, comprising:
providing a transparent substrate;
forming a light-shielding layer on the transparent substrate, the light-shielding layer absorbing exposure light of a given wavelength;
patterning the light-shielding layer so as to form a main pattern at a central region of the substrate, and a phantom pattern at a peripheral region of the substrate extending along the periphery of the main pattern, the main pattern comprising a portion of the light-shielding layer that absorbs the exposure light and thereby shields the substrate, and spaced apart exposed portions of the transparent substrate that transmit the exposure light, the phantom pattern comprising a portion of the light-shielding layer that absorbs the exposure light and thereby shields the substrate, and spaced apart exposed portions of the transparent substrate that transmit the exposure light, the pitch of the exposed portions constituting the phantom pattern being identical to the pitch of the exposed portions constituting the main pattern, the shape of the exposed portions of the substrate constituting the phantom pattern being identical to the shape of the exposed portions of the substrate constituting the main pattern, and the exposed portions of the substrate constituting the phantom pattern being narrower than the exposed portions of the substrate constituting the main pattern; and removing respective parts of the transparent substrate at each of the portions of the substrate that have been exposed along the periphery of the main pattern during the patterning of the light-shielding layer, thereby forming trenches in the substrate, and wherein all of the light-transmitting features of the mask that are disposed along the periphery of the main pattern are features formed by trenches in the substrate, whereby the light-transmitting features of said phantom pattern are formed by the trenches and will scatter incident light of said given wavelength at the periphery of the main pattern.

11. The method of claim 10, wherein said providing a transparent substrate comprises providing a quartz substrate.

12. The method of claim 10, wherein said forming a light-shielding layer on the transparent substrate comprises forming a layer including Cr or Mo, and further including a polymer on the substrate.

* * * * *